(12) United States Patent
Unmuessig et al.

(10) Patent No.: US 8,581,609 B2
(45) Date of Patent: Nov. 12, 2013

(54) SHIELDED ANTENNA FOR SYSTEM TEST OF A NON-CONTACT VOLTAGE DETECTOR

(75) Inventors: Klaus Unmuessig, Denzlingen (DE); Armin Berard, Waldkirch (DE); Lutz Rodehorst, Bad Krozingen (DE)

(73) Assignee: Fluke Corporation, Everett, WA (US)

( * ) Notice: Subject to any disclaimer, the term of this patent is extended or adjusted under 35 U.S.C. 154(b) by 597 days.

(21) Appl. No.: 12/792,602

(22) Filed: Jun. 2, 2010

(65) Prior Publication Data

US 2010/0308852 A1    Dec. 9, 2010

Related U.S. Application Data

(60) Provisional application No. 61/183,662, filed on Jun. 3, 2009.

(51) Int. Cl.
*G01R 31/3187*    (2006.01)

(52) U.S. Cl.
USPC ........................................ 324/750.3

(58) Field of Classification Search
USPC ............... 324/72.5, 754.01–754.3, 324/755.01–755.11, 762.01–762.1; 257/48; 438/14–18
See application file for complete search history.

(56) References Cited

U.S. PATENT DOCUMENTS

| 4,084,134 | A |   | 4/1978  | Nagano |   |
|---|---|---|---|---|---|
| 5,103,165 | A |   | 4/1992  | Sirattz |   |
| 5,293,113 | A |   | 3/1994  | Beha et al. |   |
| 5,877,618 | A |   | 3/1999  | Luebke et al. |   |
| 6,100,679 | A | * | 8/2000  | McCasland | 324/72.5 |
| 6,377,054 | B1 |   | 4/2002  | Beha |   |
| 6,424,139 | B2 |   | 7/2002  | Bystrom et al. |   |
| 6,507,197 | B1 | * | 1/2003  | Itoh et al. | 324/456 |
| 6,525,665 | B1 |   | 2/2003  | Luebke et al. |   |
| 6,653,826 | B2 |   | 11/2003 | Beha |   |
| 6,828,767 | B2 |   | 12/2004 | Douglas |   |
| 6,844,819 | B2 | * | 1/2005  | Luebke et al. | 340/660 |
| 7,030,599 | B2 |   | 4/2006  | Douglas |   |
| 2001/0005179 | A1 |   | 6/2001  | Hutchison |   |
| 2001/0040454 | A1 |   | 11/2001 | Beha |   |
| 2002/0167303 | A1 |   | 11/2002 | Nakano |   |
| 2005/0041624 | A1 |   | 2/2005  | Hui et al. |   |
| 2005/0046408 | A1 |   | 3/2005  | Douglas |   |
| 2008/0054882 | A1 |   | 3/2008  | Duke |   |

FOREIGN PATENT DOCUMENTS

| DE | 29811437 |    | 6/1998  |
|---|---|---|---|
| DE | 10023048 | A1 | 11/2001 |
| EP | 1336854  | A1 | 8/2003  |

OTHER PUBLICATIONS

International Application No. PCT/US2010/037296, International Search Report and Written Opinion, 8 pages, Aug. 17, 2010.

* cited by examiner

*Primary Examiner* — Tung X Nguyen
(74) *Attorney, Agent, or Firm* — Christensen O'Connor Johnson Kindness PLLC

(57) ABSTRACT

A system and method of conducting a full system test on a non-contact voltage detector while simultaneously shielding the voltage detector's antenna from stray electric fields is disclosed. When a user runs the self-test, an alternating current generator capacitively couples to the antenna through an antenna shielding to detect any breaks in the antenna. The coupled signal is amplified and filtered by the voltage detector's electronics, and triggers an indicator if the voltage detector is fully operative.

19 Claims, 4 Drawing Sheets

US 8,581,609 B2

SHIELDED ANTENNA FOR SYSTEM TEST OF A NON-CONTACT VOLTAGE DETECTOR

CROSS-REFERENCE TO RELATED APPLICATION(S)

This application claims the benefit of U.S. Provisional Application No. 61/183,662, filed Jun. 3, 2009, which is incorporated by reference.

TECHNICAL FIELD

The present disclosure relates to system testing of non-contact voltage detectors.

BACKGROUND

A non-contact voltage detector is commonly used to detect the presence of alternating current (AC) voltage, typically high voltage, without requiring physical contact with the circuit. When a voltage is detected, the user is alerted by an indication, such as a light, buzzer, or vibrating motor. In contrast to two-pole testers, which maintain physical contact with a circuit at each pole, a non-contact detector cannot be driven by the measured voltage, and so a power supply such as a battery is needed to power the detector. However, if the power source is depleted, or if an internal circuit is broken or defective, then the indicator will fail to turn on. In this situation, the non-contact detector may provide a false negative as to the presence of a voltage on the circuit being tested, potentially subjecting a user to serious injury.

SUMMARY

A non-contact voltage detector is equipped with an internal AC voltage generator that used to perform a self test. The internal AC voltage is coupled to an antenna shielding. When a test button is depressed by a user, the internal AC voltage couples to the antenna, and the voltage detector electronics drive an indicator that alerts the user that the detector is functional. When the voltage detector is on, but the test button is not depressed, the internal AC voltage does not turn on, and the antenna shielding is coupled to ground or a direct current (DC) potential. Coupling the shielding to ground or a fixed DC potential prevents the antenna from coupling to stray electric fields.

BRIEF DESCRIPTION OF THE DRAWINGS

Examples of a shielded antenna, non-contact voltage detector system and method are illustrated in the figures. The examples and figures are illustrative rather than limiting.

DETAILED DESCRIPTION

Figure 1:
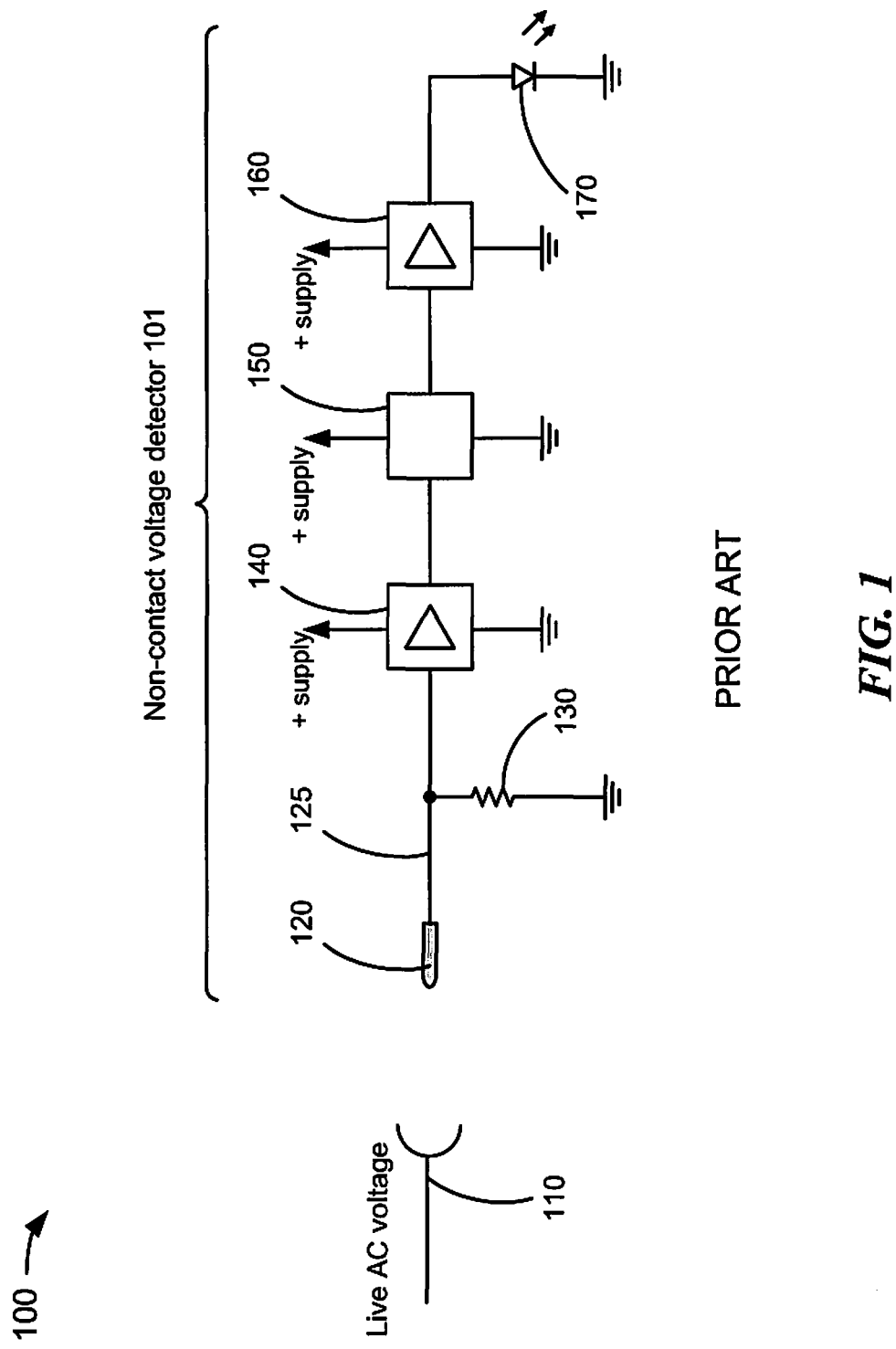
FIG. 1 depicts a block diagram of a conventional non-contact voltage detector.

The following description and drawings are illustrative and are not to be construed as limiting. Numerous specific details are described to provide a thorough understanding of the disclosure. However, in certain instances, well-known or conventional details are not described in order to avoid obscuring the description.

Without intent to further limit the scope of the disclosure, examples of instruments, apparatus, methods and their related results according to the embodiments of the present disclosure are given below. Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

The terminology used in the description presented below is intended to be interpreted in its broadest reasonable manner, even though it is being used in conjunction with a detailed description of certain specific examples of the invention. Certain terms may even be emphasized below; however, any terminology intended to be interpreted in any restricted manner will be overtly and specifically defined as such in this Detailed Description section.

A non-contact voltage detector can detect alternating current (AC) voltage through capacitive coupling to the live voltage in a circuit to be tested. Typically, a capacitor has two conductors that are separated by a dielectric material. When an AC voltage is connected across the two conductors, an AC current will flow as the electrons are alternately attracted to or repelled by the voltage on the opposite conductor. When a user uses a non-contact voltage detector to detect AC voltage from a live wire, the conducting wire and an antenna in the voltage detector form the two conductors of a capacitor, and a non-conducting tip covering the antenna in the voltage detector is the dielectric material separating the two conductors. The AC voltage from the wire couples to the antenna, and the coupled signal can be used to trigger an indicator on the voltage detector.

FIG. 1 shows a block diagram 100 of a conventional non-contact voltage detector 101. A standard non-contact voltage detector can detect a live AC voltage on a wire 110. Examples of locations where live AC voltage can be found include, but are not limited to, inside an electrical socket and in an electrical panel. The electrical systems in the United States operate at 110-120 volts, while other countries typically operate at 220-240 volts. Moreover, the outlets have different shapes in different geographical regions to accommodate different plug shapes. The non-contact voltage detector has a non-conducting tip 120 with a tapered shape that is designed to fit within a particular type of outlet to be tested.

One end of a metallic antenna 125 resides inside the non-conducting tip 120. The other end of the antenna 125 is coupled to a defined input impedance 130 that couples to ground. The input impedance 130 can be varied to adjust for sensitivity of different outlet voltages for different geographical regions.

The metallic antenna 125 in the non-conducting tip 120 capacitively couples to a live wire 110, and the coupled AC signal is sent to the block 140 which has a very high gain for amplifying the signal. The amplified signal is sent to the next box 150 which has filters and other electronics. Then there is a final amplifier 160 that drives a circuit for indicating when the non-contact voltage detector has sensed an external AC voltage. The indicator can be a lamp 170 or other indicator like a vibrational motor.

The circuit elements 140, 150, 160, and 170 are driven by a power supply, such as a battery. However, if the battery dies or the electronic circuit breaks, the voltage detector indicator will not turn on. Thus, when an external AC voltage is present in the outlet or circuit being tested, a false negative will result when a user attempts to detect an external AC voltage with a malfunctioning voltage detector, potentially placing the user at risk of electrical shock. Some non-contact voltage detectors use a battery test button or an on-switch with an indicator to show when the unit is ready to sense voltage. However, a risk of electrical shock from an unidentified live voltage remains if the electrical circuitry is broken, although the battery is charged.

Figure 2:
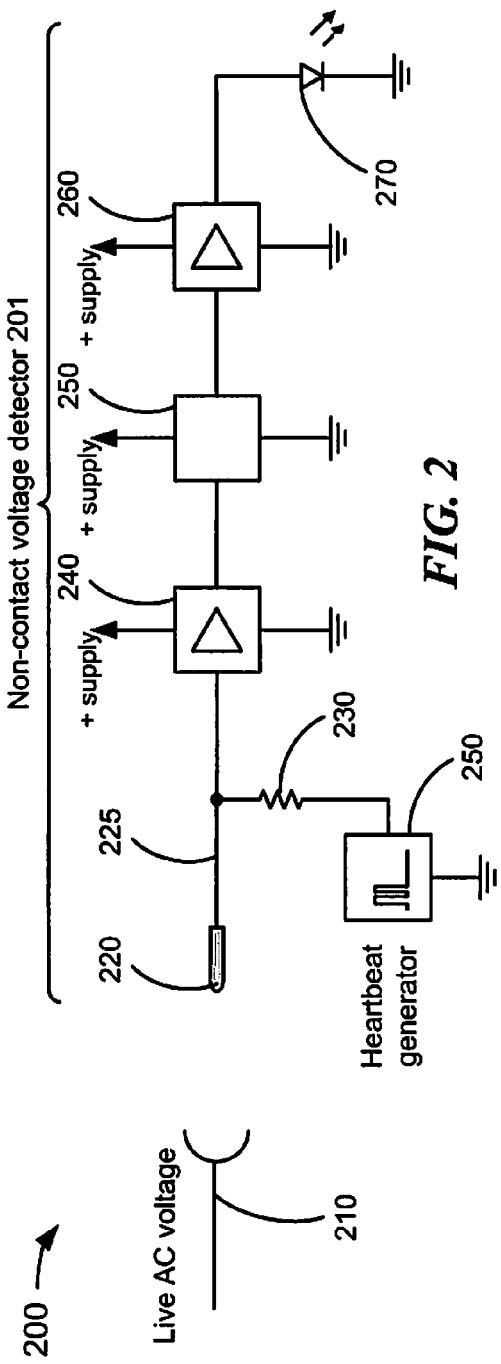
FIG. 2 depicts a block diagram of a known non-contact voltage detector capable of performing a partial self-test.

FIG. 2 shows a block diagram of a non-contact voltage detector 201 capable of performing a partial self-test. Similar to the standard voltage detector 101, the antenna 225 capacitively couples to a live AC voltage on a wire 210 through a non-conducting sheath 220 at the tip of the antenna 225. The coupled AC signal is amplified by block 240 and filtered by block 250. Then block 260 drives the circuit for the indicator 270 when external AC voltage has been coupled.

The non-contact voltage detector 201 additionally includes a DC (direct current) voltage heartbeat generator 250, which is used to create twin voltage pulses that are fed in parallel to the antenna 225 through an input impedance 230 to the input of the sensing device. The DC voltage generator 250 can be used to self-test the electronics in the voltage detector 201, except for the antenna 225. The generator 250 automatically turns on when the voltage detector 201 is turned on. Block 240 provides high gain amplification of the DC voltage. Block 250 filters the DC voltage, and then block 260 amplifies the voltage to drive the indicator. Because the DC voltage generates a twin pulse sequence, the indicator light will emit a corresponding double blink when the voltage detector 201 is working properly. The DC generator 250 can be designed to generate any distinctive pulse sequence. If the battery is dead or the internal circuitry is broken, the indicator will not turn on. Thus, prior to using the voltage detector 201 for detecting an external AC voltage, the user can first watch the indicator to determine if the voltage detector 201 is functioning properly.

The electronics in block 250 can include a microcontroller or state machine or other hard-wired logic to check whether the output from the amplifier of block 240 corresponds to the DC voltage pattern generated by generator 250. If there is a difference between the generated DC voltage and the detected output, then the DC voltage generator 250 is turned off and the voltage detector senses just external AC voltage, similar to the standard voltage detector 101. If an external voltage is sensed, the indicator 270 is turned on by amplifier block 260. When the frequency of the AC voltage is very high, the indicator light will appear to be on continuously to the human eye, thus distinguishing from the double blink indicator of the self-test result. If no external voltage is sensed, then the indicator 270 will perform the double blink described above if the voltage detector is functional. However, it can be confusing for a user to differentiate between the indicator status for the self-test and the indicator status for sensing an external AC voltage because the same indicator is used for both.

Because the heartbeat generator 250 is located parallel to the antenna 225, the electronics is not capable of detecting if there is a break in the antenna 225. If there is a break in the antenna 225, the voltage detector 201 will not sense an external AC voltage because little to no capacitive coupling will occur. Then the voltage detector 201 will not turn on the indicator 270, and the user will think that there is no sensed voltage, even though voltage is present.

Figure 3:
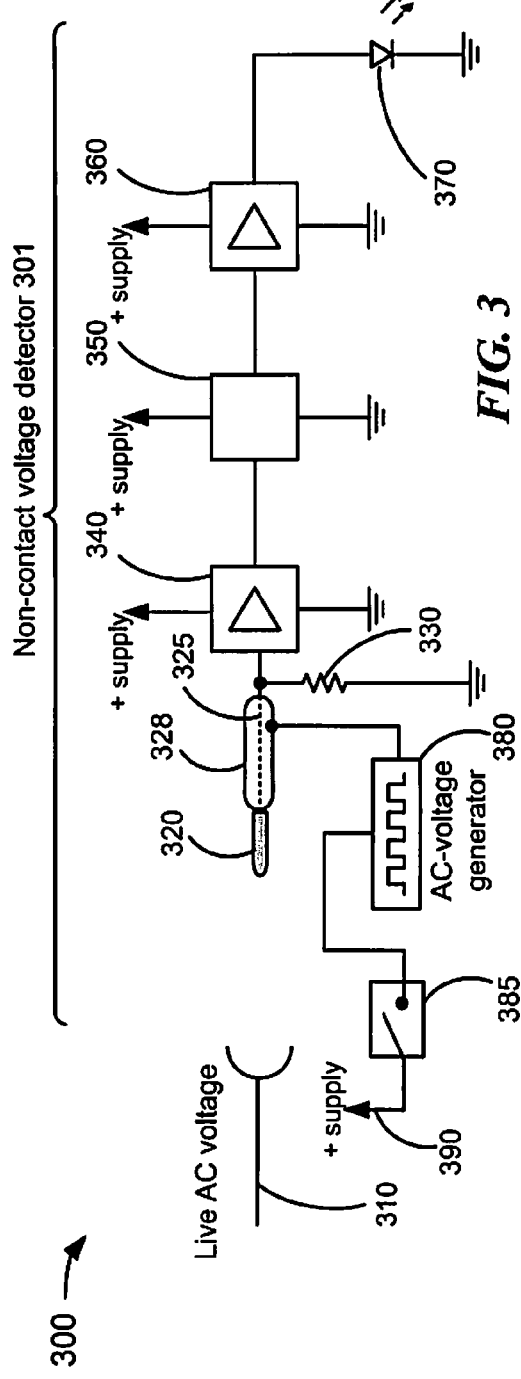
FIG. 3 depicts a block diagram of a non-contact voltage detector having a shielded antenna, according to an embodiment of the disclosure.

The voltage detector 301 shown in FIG. 3 is capable of performing a full self-test, including detecting breaks in the antenna. FIG. 3 shows a block diagram 300 of a non-contact voltage detector 301 having a shielded antenna, according to an embodiment of the disclosure.

The non-contact voltage detector 301 has a metallic antenna 325 for capacitively coupling to AC voltage in an external wire 310. The tip of the metallic antenna 325 is sheathed in a non-conducting tip 320, while the other end of the antenna couples to the input amplifier 340. Because the non-conducting tip 320 should have an appropriate shape for fitting within particular electrical outlets, the antenna will necessarily have a length of at least a few centimeters in order to reach the first amplifier block 340. The antenna length beyond the non-conducting tip 320 senses and responds to surrounding electrical fields that do not emanate from the targeted outlet or wire to be tested. For example, in a three-phase circuit outlet, if one of the phases is switched off by a blown fuse or open breaker, and the other two phases are still live, then some electric fields could still be present and result in a misreading. Thus, the antenna length can inadvertently couple to stray electric fields, resulting in a false positive reading by the voltage detector 301.

To minimize the likelihood that the length of the antenna 325 will capacitively couple to stray electric fields in the vicinity of the antenna, the antenna 325 can be shielded with a shielding 328 that encloses the length of the antenna 325 not enclosed by the non-conducting tip 320 and covers most of the antenna 325 up to the input amplifier 340. The antenna shielding 328 is not coupled directly to ground, but rather it is coupled to the output of an internal AC voltage generator 350 which, by default, has a ground potential or a fixed DC potential when the generator is off. As a result, when the voltage detector 301 is used to test an unknown wire or outlet, the antenna shielding 328 is grounded or fixed at a DC potential to prevent stray electric fields from affecting the measurement.

Further, the internal AC voltage generator 380 can be used to fully self-test the voltage detector 301. When a user presses and holds a test button 385, the power source 390 is coupled to the generator 380, and the generator 380 generates an AC voltage. Because the voltage is AC and is coupled to the antenna shielding 328, it can capacitively couple to the antenna 325. Then input amplifier 340 senses and amplifies the coupled AC voltage.

The block 350 can include filters and other electronics. The output from block 350 is sent to amplifier block 360 which drives an indicator circuit. The indicator 170 can be a lamp or any other indicator. The circuit elements 340, 350, 360, 370, 380 are driven by a power source (not shown) such as a battery.

In the self-test mode, when the user holds down the test button, the indicator will light up if the voltage detector 301 is operating correctly, including when the power source is still capable of powering the voltage detector 301 and whether there are any breaks in the circuitry or antenna. In the external AC voltage detection mode, when the device 301 is on but the test button is not activated, the indicator will light up only if an AC voltage is detected. It will be understood that the indicator can be any type of device, such as a light, sound generator, vibrational motor, or any combination thereof.

The antenna shielding 328 is comprised of at least an insulating layer that wraps around the metallic antenna 325 and a conducting layer that wraps around the insulating layer, where the AC voltage generator couples to the conducting layer. Optionally, other layers can wrap around the external conducting layer. In one embodiment, the shielding 328 can be a coaxial cable. The coaxial cable surrounds the antenna 325 with a first dielectric insulating layer. Then a metallic layer wraps around the insulating layer, and a second insulating layer wraps around the metallic layer.

In one embodiment, the shielding 328 can comprise a sheet of metal bent appropriately to surround the antenna 325 with insulation placed between the antenna and the sheet metal.

In one embodiment, the shielding 328 can comprise a multi-layer printed circuit board (PCB), where the PCB can be the same one on which the electronics for the voltage detector 301 are located. For example, a two-layer PCB can be used where the PCB is covered with a sheet of metal. The PCB and metal are then wrapped around the antenna 325.

In one embodiment, the shielding 328 can comprise one or more of the outermost layers of a multi-layer PCB, and the antenna 325 is the innermost layer of the multi-layer PCB.

Figure 4:
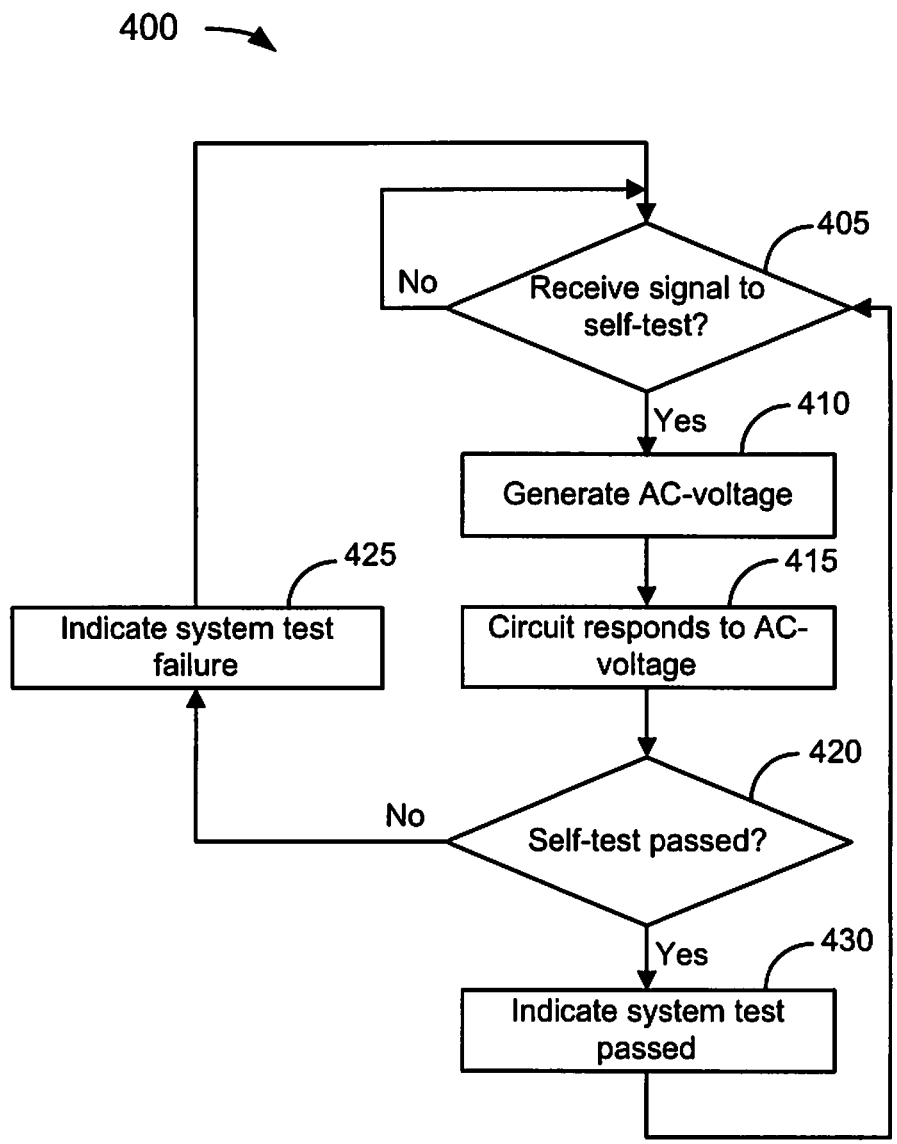
FIG. 4 depicts a flow diagram illustrating an exemplary process of self-testing a non-contact voltage detector, according to an embodiment of the disclosure.

FIG. 4 depicts a flow diagram 400 illustrating an exemplary process of self-testing a non-contact voltage detector, according to an embodiment of the disclosure. At decision block 405, the voltage detector waits for a signal that a system self-test should be performed. The voltage detector has a test button or equivalent switch that, when pressed by a user, couples an internal AC voltage generator to a shielding 328 of the antenna 325. When the test button is not depressed, the shielding 328 of the antenna 325 is grounded or fixed at a DC potential. If the voltage detector does not receive a self-test signal (block 405—No), the system remains at decision block 405. If the voltage detector receives a signal to self-test the system (block 405—Yes), at block 410 the voltage detector generates an AC voltage with the internal AC generator.

Then at block 415, the voltage detector circuitry responds to the coupled AC voltage. At decision block 420, the voltage detector determines if the system passed the self-test. The system passes the self-test if the circuitry is performing properly and the power source is sufficient to power the voltage detector. The system fails the self-test if there is a malfunction in the voltage detector, such as a dead battery, a broken antenna, or a broken circuitry.

If system fails the self-test (block 420—No), at block 425 the voltage detector indicates failure of the test, and the process returns to decision block 405. Indication of failure of the self-test can include, but is not limited to, a light that does not light up or a buzzer that does not sound. If the system passes the self-test (block 420—Yes), at block 430 the voltage detector indicates the system passed the self-test. Indication that the system passed the self-test can include, but is not limited to, lighting of a photodiode or other light, or sounding of a buzzer. The process returns to decision block 405.

Figure 5:
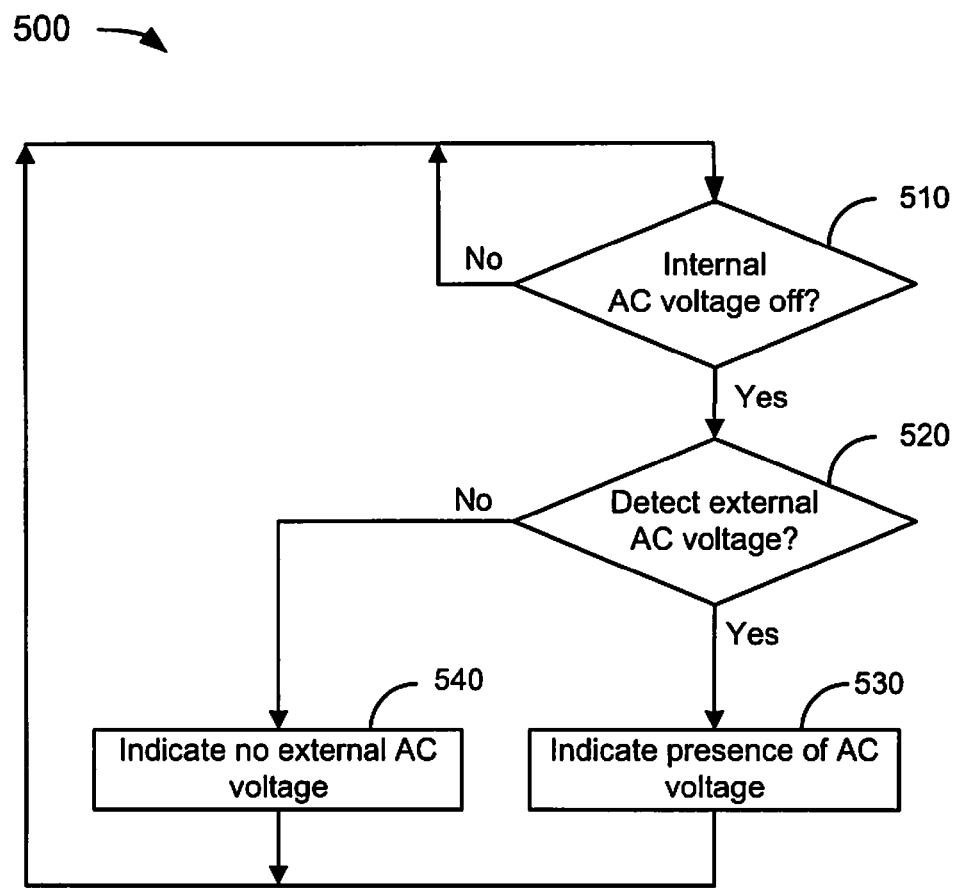
FIG. 5 depicts a flow diagram illustrating an exemplary process of detecting an external AC voltage using a self-testing non-contact voltage detector, according to an embodiment of the disclosure.

FIG. 5 depicts a flow diagram 500 illustrating an exemplary process of detecting an external AC voltage using a self-testing non-contact voltage detector, according to an embodiment of the disclosure. At decision block 510, the voltage detector determines if the internal AC voltage generator is off. If the internal AC voltage generator is on (block 510—No), the voltage detector remains at decision block 510.

If the internal AC voltage generator is off (block 510—Yes), at decision block 520 the voltage detector determines the presence of an external AC voltage. If no external AC voltage is sensed (block 520—No), at block 540 the voltage detector indicates that there is no external AC voltage. Indication of the lack of an external AC voltage can include, but is not limited to, a light that does not light up or a buzzer that does not sound. The process then returns to decision block 510. If the voltage detector senses the presence of an external AC voltage (block 520—Yes), at block 530 the voltage detector makes the appropriate indication. Indication that an external AC voltage is present can include, but is not limited to, lighting of a photodiode or sounding of a buzzer. The process then returns to decision block 510.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this patent application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

What is claimed is:

1. A self-powered non-contact voltage detector having an internal alternating current (AC) voltage source, an antenna configured to sense external AC voltage, a power source, and circuitry coupled to the antenna, wherein the internal AC voltage source generates a predetermined AC voltage, and further wherein the self-powered non-contact voltage detector is configured to self-test parts of the non-contact voltage detector.

2. The self-powered non-contact voltage detector of claim 1 wherein the antenna has a non-conducting sheath at a distal end, the internal AC voltage source is coupled to a shielding for the antenna, and AC pulses generated by the AC voltage source couple to the antenna through the shielding.

3. The self-powered non-contact voltage detector of claim 2 wherein the shielding is conductive and reduces capacitive coupling of stray external electric fields to the antenna.

4. The self-powered non-contact voltage detector of claim 2 wherein the shielding is situated between the non-conducting sheath and the circuitry coupled to the antenna.

5. A non-contact voltage detector comprising:
an antenna configured to capacitively couple to alternating current (AC) voltage;
an internal AC voltage source configured to generate predetermined AC voltage pulses to couple to the antenna when turned on and to have a ground or DC potential when turned off;
a switch configured to be activated by a user to self-test the non-contact voltage detector, wherein activation of the switch turns on the internal AC voltage source, and deactivation of the switch turns off the internal AC voltage source;
an antenna configured to indicate using an indicator a first status of a self-test when the switch is activated and a second status of presence of external AC voltage when the switch is deactivated; and
a power source configured to power the internal AC voltage source and the indicator.

6. The non-contact voltage detector of claim 5, further comprising a shielding for the antenna configured to minimize coupling of stray external electric fields to the antenna, wherein the shielding comprises one or more outer layers of a multi-layer printed circuit board, and the antenna is an innermost layer of the multi-layer printed circuit board, and further wherein the internal AC voltage source is coupled to the shielding for the antenna, and the AC pulses generated by the AC voltage source couple to the antenna through the shielding.

7. The non-contact voltage detector of claim 5, further comprising a shielding for the antenna configured to minimize coupling of stray external electric fields to the antenna, wherein the antenna has a non-conducting sheath at a distal end, the internal AC voltage source is coupled to the shielding for the antenna, and the AC pulses generated by the AC voltage source couple to the antenna through the shielding.

8. The non-contact voltage detector of claim 7 wherein the shielding comprises an insulating layer wrapped around the antenna, and a conducting layer wrapped around the insulating layer.

9. The non-contact voltage detector of claim 7 wherein the shielding comprises a coaxial cable.

10. The non-contact voltage detector of claim 7 wherein the shielding comprises a printed circuit board covered with a sheet of metal wrapped around the antenna.

11. A non-contact voltage detector comprising:
an antenna configured to capacitively couple to alternating current (AC) voltage;
an internal AC voltage source configured to generate predetermined AC voltage pulses to couple to the antenna when turned on and to have a ground or DC potential when turned off;
means for switching configured to be activated by a user to self-test the non-contact voltage detector, wherein activation of the means for switching turns on the internal AC voltage source and deactivation of the means for switching turns off the internal AC voltage source;
means for indicating configured to indicate a first status of a self-test when the means for switching is activated and a second status of presence of external AC voltage when the means for switching is deactivated; and
means for powering configured to power the internal AC voltage source and the means for indicating.

12. The non-contact voltage detector of claim 11, further comprising a means for shielding the antenna configured to minimize coupling of stray external electric fields to the antenna, wherein the means for shielding comprises one or more outer layers of a multi-layer printed circuit board, and the antenna is an innermost layer of the multi-layer printed circuit board, and further wherein the internal AC voltage source is coupled to the means for shielding for the antenna, and the AC pulses generated by the AC voltage source couple to the antenna through the shielding.

13. The non-contact voltage detector of claim 11, further comprising a means for shielding the antenna configured to minimize coupling of stray external electric fields to the antenna, wherein the antenna has a non-conducting sheath at a distal end, the internal AC voltage source is coupled to the means for shielding the antenna, and the AC voltage pulses generated by the AC voltage source couple to the antenna through the means for shielding.

14. The non-contact voltage detector of claim 13 wherein the means for shielding comprises an insulating layer wrapped around the antenna, and a conducting layer wrapped around the insulating layer.

15. The non-contact voltage detector of claim 13 wherein the means for shielding comprises a coaxial cable.

16. The non-contact voltage detector of claim 13 wherein the means for shielding comprises a printed circuit board covered with a sheet of metal wrapped around the antenna.

17. A method of self-testing a non-contact voltage detector, comprising:
receiving an input from a user to self-test the non-contact voltage detector;
turning on an internal alternating current (AC) voltage generator, wherein the internal AC voltage generator is coupled to a shielding for an antenna of the non-contact voltage detector, and further wherein the internal AC voltage generator generates a predetermined AC voltage; and driving an indicator circuit to provide an indication whether the non-contact voltage detector is functional.

18. The method of claim 17, further comprising:

turning off the internal AC voltage generator when the input to self-test is no longer received, wherein the AC voltage generator has a ground or DC potential in an off state and remains coupled to the shielding for the antenna;

coupling any external AC voltage through a distal end of the antenna; and driving the indicator circuit to provide an indication whether any external AC voltage is present.

19. The method of claim 18 wherein the distal end of the antenna has a non-conducting sheath, and the shielding is conductive.

* * * * *